(12) United States Patent
Kawagoe

(10) Patent No.: US 7,230,263 B2
(45) Date of Patent: Jun. 12, 2007

(54) GALLIUM NITRIDE COMPOUND SEMICONDUCTOR ELEMENT

(75) Inventor: Kimihiro Kawagoe, Anan (JP)

(73) Assignee: Nichia Corporation, Tokushima (JP)

( * ) Notice: Subject to any disclaimer, the term of this patent is extended or adjusted under 35 U.S.C. 154(b) by 112 days.

(21) Appl. No.: 10/474,808

(22) PCT Filed: Apr. 8, 2002

(86) PCT No.: PCT/JP02/03475

§ 371 (c)(1),
(2), (4) Date: Oct. 14, 2003

(87) PCT Pub. No.: WO02/084831

PCT Pub. Date: Oct. 24, 2002

(65) Prior Publication Data

US 2004/0124500 A1 Jul. 1, 2004

(30) Foreign Application Priority Data

Apr. 12, 2001 (JP) .................................. 2001-114025

(51) Int. Cl.
H01L 29/06 (2006.01)
H01L 31/0328 (2006.01)
H01L 31/0336 (2006.01)
H01L 31/072 (2006.01)
H01L 31/109 (2006.01)

(52) U.S. Cl. ............................. 257/13; 257/94; 257/96; 257/101; 257/103; 257/548

(58) Field of Classification Search ................. 257/13, 257/94, 96, 101, 103, 548
See application file for complete search history.

(56) References Cited

U.S. PATENT DOCUMENTS

| 5,578,839 | A |  | 11/1996 | Nakamura et al. |
| 5,777,350 | A |  | 7/1998 | Nakamura et al. |
| 5,780,876 | A |  | 7/1998 | Hata |
| 5,786,603 | A |  | 7/1998 | Rennie et al. |
| 5,786,606 | A |  | 7/1998 | Nisio et al. |
| 5,841,802 | A |  | 11/1998 | Whiteley et al. |
| 5,929,466 | A | * | 7/1999 | Ohba et al. .................. 257/103 |
| 5,945,689 | A |  | 8/1999 | Koike et al. |
| 5,959,307 | A |  | 9/1999 | Nakamura et al. |
| 6,153,894 | A |  | 11/2000 | Udagawa |
| 6,172,382 | B1 |  | 1/2001 | Nagahama et al. |
| 6,242,761 | B1 |  | 6/2001 | Fujimoto et al. |
| 6,252,894 | B1 |  | 6/2001 | Sasanuma et al. |
| 6,320,893 | B1 |  | 11/2001 | Ueki |
| 6,388,275 | B1 | * | 5/2002 | Kano ........................... 257/94 |
| 6,423,984 | B1 |  | 7/2002 | Kato et al. |

(Continued)

FOREIGN PATENT DOCUMENTS

EP        762 516        3/1997

(Continued)

OTHER PUBLICATIONS

Official Action dated Jun. 7, 2005, Japanese Patent Application No. 2002–109309.

*Primary Examiner*—David E. Graybill
(74) *Attorney, Agent, or Firm*—Nixon & Vanderhye P.C.

(57) ABSTRACT

In a gallium nitride semiconductor device comprising an active layer made of an n-type gallium nitride semiconductor that includes In and is doped with n-type impurity and a p-type cladding layer made of a p-type gallium nitride semiconductor that includes Al and is doped with p-type impurity, a first cap layer, made of a gallium nitride semiconductor that includes n-type impurity of lower concentration than that of said active layer and p-type impurity of lower concentration than that of said p-type cladding layer, and a second cap layer made p-type gallium nitride semiconductor that includes Al and is doped with p-type impurity are stacked one on another between said active layer and said p-type cladding layer.

12 Claims, 3 Drawing Sheets

U.S. PATENT DOCUMENTS

| | | | |
|---|---|---|---|
| 6,441,393 B2 | 8/2002 | Goetz et al. | |
| 6,492,660 B2 * | 12/2002 | Uchida | 257/79 |
| 6,534,800 B1 * | 3/2003 | Ohbo et al. | 257/103 |
| 6,580,736 B1 * | 6/2003 | Yoshie et al. | 372/45 |
| 6,586,762 B2 | 8/2003 | Kozaki | |
| 6,657,234 B1 | 12/2003 | Tanizawa | |
| 6,838,693 B2 | 1/2005 | Kozaki | |
| 2001/0020440 A1 * | 9/2001 | Morita | 117/97 |

FOREIGN PATENT DOCUMENTS

| | | |
|---|---|---|
| EP | 803 916 | 10/1997 |
| EP | 1 041 650 | 10/2000 |
| EP | 1 122 841 | 8/2001 |
| EP | 1 168 539 | 1/2002 |
| GB | 2323210 | 9/1998 |
| JP | 5-206513 | 8/1993 |
| JP | 8-111558 | 4/1996 |
| JP | 8-293623 | 11/1996 |
| JP | 8-293643 | 11/1996 |
| JP | 9-129926 | 5/1997 |
| JP | 9-36423 | 7/1997 |
| JP | 9-266326 | 10/1997 |
| JP | 9-293935 | 11/1997 |
| JP | 10-12923 | 1/1998 |
| JP | 10-12969 | 1/1998 |
| JP | 10-004210 | 1/1998 |
| JP | 10-012922 | 1/1998 |
| JP | 10-163523 | 6/1998 |
| JP | 10-242565 | 9/1998 |
| JP | 10-256601 | 9/1998 |
| JP | 11-54847 | 2/1999 |
| JP | 11-274644 | 10/1999 |
| JP | 11-298090 | 10/1999 |
| JP | 11-340559 | 12/1999 |
| JP | 2000-91630 | 3/2000 |
| JP | 2000-156544 | 6/2000 |
| JP | 2000-208814 | 7/2000 |
| JP | 2000-208875 | 7/2000 |
| JP | 2000-286447 | 10/2000 |
| JP | 2000-349377 | 12/2000 |
| JP | 2000-349398 | 12/2000 |
| JP | 2001-044570 | 2/2001 |
| JP | 2001-077413 | 3/2001 |
| JP | 2002-084038 | 2/2002 |
| WO | WO/0076004 | 12/2000 |

* cited by examiner

GALLIUM NITRIDE COMPOUND SEMICONDUCTOR ELEMENT

This application is the U.S. national phase of international application PCT/JP02/03745, filed Apr. 8, 2002, which designated the U.S.

TECHNICAL FIELD

The present invention relates to a gallium nitride semiconductor device that uses nitride semiconductor ($In_xAl_yGa_{1-x-y}N$, $0 \leq X$, $0 \leq Y$, $X+Y \leq 1$), particularly to a gallium nitride semiconductor device having an active layer that includes In.

BACKGROUND ART

Gallium nitride semiconductor devices that use nitride semiconductor are used in light emitting devices such as light emitting diode device (LED) and laser diode device (LD), light receiving devices such as solar cell and light sensor, and electronic devices such as transistor and powder devices. Semiconductor laser device that employs nitride semiconductor, in particular, is believed to be capable of oscillating in a wide range of visible light spectrum from ultraviolet to red light, and is expected to have variety of applications such as light sources for laser printer and optical network in addition to the light source for optical disk system.

The gallium nitride semiconductor device of the prior art often has pn heterojunction that combines an n-type active layer including In and p-type cladding layer including Al, as the basic structure. Since the n-type active layer including In can easily decompose, a thin cap layer made of AlGaN is often formed between the n-type active layer and the p-type cladding layer in order to prevent the active layer from decomposing when growing the p-type cladding layer at a relatively high temperature.

FIG. 3 shows a schematic sectional view of a nitride semiconductor laser as an example of the gallium nitride semiconductor device of the prior art. The nitride semiconductor laser shown in FIG. 3 has double heterojunction structure wherein an MQW active layer made of InGaN is interposed between the n-type and p-type AlGaN cladding layers. An n-type AlGaN contact layer 103, an n-type InGaN crack prevention layer 104, an n-type AlGaN/GaN super-lattice cladding layer 105, an undoped GaN optical guide layer 106, a quantum well active layer 107 made of InGaN, a p-type AlGaN cap layer 108, an undoped GaN optical guide layer 109, p-type AlGaN/GaN super-lattice cladding layer 110, and a p-type GaN contact layer 111 are stacked successively via a buffer layer 102 on a GaN substrate 101 that was grown by ELOG process. Reference numeral 162 denotes a protective film made of $ZrO_2$, 164 denotes a multi-layer dielectric film made of $SiO_2$ and $TiO_2$, 120 denotes a p-type electrode, 121 denotes an n-type electrode and 122 and 123 denote lead-out electrodes.

The active layer 107 has such an MQW structure as undoped $In_{x1}Ga_{1-x1}N$ well layers ($0<x1<1$) and undoped $In_{x2}Ga_{1-x2}N$ barrier layers ($0 \leq x2<1$, $x1>x2$) are stacked alternately a required number of times. The p-type AlGaN cap layer 108, together with the active layer 107, forms a pn heterojunction so as to effectively confine electrons within the active layer 107 thereby to reduce the threshold of the laser. Also because the p-type cap layer 108 has a role to supply holes to the active layer 107, it is doped with Mg in a high concentration. The p-type cap layer 108 may be grown to a small thickness of about 15 to 500 Å, and as a thin film, it can be grown at a lower temperature than in the case of the p-type optical guide layer 109 and the p-type optical cladding layer 110. Consequently, forming the p-type cap layer 108 makes it easier to suppress the decomposition of the active layer 107 that includes In than in the case of forming the p-type optical guide layer 109 and other layers directly on the active layer.

The gallium nitride semiconductor laser having the structure shown in FIG. 3 is capable of achieving a long lifetime of more than 10,000 hours under the condition of continuous oscillation with an output power of 5 mW at the room temperature.

However, there is a demand to increase the lifetime of the gallium nitride semiconductor device in order to expand the applications thereof. For the gallium nitride semiconductor laser, in particular, it is extremely important to increase the lifetime of the device and there is also a demand to improve the threshold characteristic of operation at high temperatures.

DISCLOSURE OF THE INVENTION

The present inventors have completed the present invention by paying attention to the facts about gallium nitride semiconductor device that (1) lifetime of the device increases and the temperature characteristic improves when impurity concentration in the p-type cap layer that is adjacent to the n-type active layer is lower, and that (2) n-type impurity and p-type impurity cancel each other in the interface of pn junction between the n-type active layer and the p-type cap layer, thus resulting in the presence of impurity that does not contribute to the creation of carrier.

The fact (2) described above will now be explained in more detail below with reference to FIG. 2A. FIG. 2A is a schematic diagram showing the interface of pn junction between the p-type cap layer 108 and the n-type active layer 107 in the nitride semiconductor device of the prior art. As shown in the drawing, the p-type impurity 10 injected into the p-type cap layer 108 by doping releases holes (indicated by letter a in the drawing) and the n-type impurity 12 injected into the n-type active layer 107 by doping releases electrons (indicated by letter b in the drawing), so that the holes and electrons form the device current as carriers. When the p-type cap layer is grown on the n-type active layer, however, part of the p-type impurity 10 included in the p-type cap layer infiltrates the n-type active layer through thermal diffusion and, conversely, part of the n-type impurity 12 included in the n-type active layer infiltrates the p-type cap layer through thermal diffusion. As a result, part of the p-type impurity 10 and part of the n-type impurity 12 coexist in the same region near the interface of pn junction, such that donor and acceptor cancel each other as indicated by letter c in the drawing and cannot contribute to the effective creation of carrier.

To solve the problems described above, the present invention provides the gallium nitride semiconductor device comprising active layer made of n-type gallium nitride semiconductor that includes In and is doped with n-type impurity and a p-type cladding layer made of a p-type gallium nitride semiconductor that includes Al and is doped with p-type impurity, wherein a first cap layer, made of gallium nitride semiconductor that includes n-type impurity of lower concentration than that of the active layer and p-type impurity of lower concentration than that of the p-type cladding layer, and a second cap layer made of a p-type gallium nitride semiconductor that includes Al and is doped with p-type impurity are stacked one on another between the active layer and the p-type cladding layer.

Preferably, the first cap layer is formed in contact with the active layer, and the second cap layer is formed in contact with the first cap layer. More preferably the p-type optical guide layer is formed in contact with the second cap layer.

FIG. 2B is a schematic diagram showing the interface of pn junction between the p-type cap layer 108 and the n-type active layer 107 in the nitride semiconductor device of the present invention. According to the present invention, as shown in FIG. 2B, since the first cap layer 108a that includes the n-type impurity and the p-type impurity both in low concentrations is provided between the n-type active layer and the p-type cap layer (that is the second cap layer 108b), compensation of donor and acceptor can be more effectively suppressed than in the case where the p-type cap layer including high concentration of impurity makes direct contact with the n-type active layer (the case shown in FIG. 2A). As a result, quantity of the p-type impurity injected into the p-type cap layer (namely the second cap layer) by doping can be reduced in correspondence to the suppressed compensation, thereby improving the device lifetime and characteristic temperature.

While there is no limitation to the final impurity concentration in the device, it is preferable that concentration of the n-type impurity and the p-type impurity in the first cap layer is not higher than $1.0 \times 10^{17}$ cm$^{-3}$, and concentration of the p-type impurity in the second cap layer is in a range from $8.0 \times 10^{18}$ to $2.0 \times 10^{19}$ cm$^{-3}$. In the present application, concentration of the n-type impurity and the p-type impurity in the first cap layer refers to a value averaged in the direction of layer thickness. The concentration of the n-type impurity and the p-type impurity in the first cap layer has a gradient in the direction of layer thickness due to thermal diffusion from other layers. That is, concentration of the n-type impurity in the first cap layer is higher at a position near the active layer, and decreases with the distance from the active layer. Conversely, concentration of the p-type impurity in the first cap layer is higher at a position near the second cap layer, and decreases as the distance from the second cap layer increases.

In order to effectively suppress the compensation of donor and acceptor, the first cap layer is preferably grown without doping with the n-type impurity and the p-type impurity. Even when grown without doping with the impurities, the first cap layer includes the n-type impurity due to thermal diffusion from the active layer and the p-type impurity due to thermal diffusion from the second cap layer.

The first cap layer that includes impurity of a low concentration has a high resistance. Therefore, from the viewpoint of suppressing the driving voltage of the device, the first cap layer is preferably thinner. From the viewpoint of suppressing the compensation of the p-type impurity and the n-type impurity, on the other hand, the first cap layer is preferably thicker. The effect of suppressing the compensation of donor and acceptor becomes maximum when sum of the thermal diffusion distance of the n-type impurity, that is injected into the active layer, in the first cap layer and the thermal diffusion distance of the p-type impurity, that is injected into the second cap layer, in the first cap layer is substantially equal to the thickness of the first cap layer. With this relationship, the region where the p-type impurity drifting from the second cap layer by thermal diffusion and the n-type impurity drifting from the n-type active layer by thermal diffusion coexist disappears by theory. The thermal diffusion distances of the n-type impurity and the p-type impurity in the first cap layer are set to have values at the process temperature where thermal diffusion of the impurity into the first cap layer occurs most actively. That is, the expression of "the thermal diffusion distance of the n-type impurity in the first cap layer" refers to the thermal diffusion distance traveled by the n-type impurity at the growing temperature (in terms of absolute temperature) of the first cap layer. The expression of "the thermal diffusion distance of the p-type impurity in the first cap layer" refers to the thermal diffusion distance traveled by the p-type impurity at the growing temperature (in terms of absolute temperature) of the second cap layer. In case an active layer having multiple quantum well structure that has at least well layers and barrier layers is stopped with an undoped layer, the effect of suppressing the compensation of impurities becomes maximum when the total thickness of the undoped layer and the first cap layer is equal to the sum of the thermal diffusion distances. In case an active layer having multiple quantum well structure where undoped well layers and n-type impurity-doped barrier layers are stacked alternately and the active layer is stopped with the undoped well layer, for example, the effect of suppressing the compensation of impurities becomes maximum when the total thickness of the well layer and the first cap layer is equal to the sum of the thermal diffusion distances.

The thermal diffusion distance L herein refers to the distance traveled by diffusing impurities in t seconds, with L being given as the square root of (D·t) (L is a theoretical value). D is the diffusion constant given by $D = D_0 \cdot a^2 \exp(-U/kT)$, where $D_0$ is the diffusion constant at the initial stage of growing, "a" is the lattice constant of the material, "U" is the potential energy of the material, "k" is the Boltzmann constant and "T" is temperature.

For the first cap layer, for example, GaN layer, $In_xGa_{1-x}N$ layer ($0<x<1$) and $Al_yGa_{1-y}N$ layer ($0<y<1$) may be used. Alternatively, one consisting of two or more of these layers stacked one on another may also be used. GaN layer is preferable because it is effective in suppressing the dissoociation of In in the active layer and makes it easier to form a layer of good crystallinity. $In_xGa_{1-x}N$ layer is preferable because it does not increase $V_f$ even when formed in a thick layer and can be stacked with good crystallinity. $Al_yGa_{1-y}N$ layer ($0<y<1$) is preferable because it is most effective in suppressing the dissoociation of In in the active layer.

As mentioned previously, preferable thickness of the first cap layer depends on the sum of the thermal diffusion distances of the n-type impurity and the p-type impurity in the first cap layer, and therefore varies depending on the composition of the first cap layer. In case the first cap layer comprises a GaN layer, for example, thickness of the first cap layer is preferably in a range from 15 to 100 Å (more preferably from 50 to 80 Å). In case the first cap layer comprises an $In_xGa_{1-x}N$ layer ($0<x<1$), thickness is preferably in a range from 15 to 150 Å (more preferably from 85 to 115 Å). In case the first cap layer comprises an $Al_yGa_{1-y}N$ layer ($0<y<1$), thickness is preferably in a range from 15 to 50 Å (more preferably from 20 to 50 Å).

The thickness of the second cap layer is preferably in a range from 15 to 500 Å in order to obtain a film of good crystallinity at a lower temperature.

The active layer may be formed either in bulk, single quantum well structure or multiple quantum well structure, as long as it is made of gallium nitride semiconductor that includes In and is doped with an n-type impurity. Among such structures, the active layer preferably has quantum well structure in which well layers made of gallium nitride semiconductor that includes In and barrier layers made of gallium nitride semiconductor doped with n-type impurity are stacked alternately. In this case, the first cap layer may include n-type impurity in a lower concentration than that of the barrier layer.

The n-type impurity used in the gallium nitride semiconductor device of the present invention may be Si, Ge, Sn, S, O or the like, and is preferably Si or Sn. While there is no limitation to the p-type impurity, it may be Be, Zn, Mn, Cr, Mg, Ca or the like, and Mg is preferably used.

In this specification, the term "undoped" refers to the state of nitride semiconductor being grown without p-type impurity nor n-type impurity being added as dopant. For example, it means growing by metalorganic vapor phase epitaxy process without supplying an impurity as dopant into a reaction vessel.

BEST MODE FOR CARRYING OUT THE INVENTION

Preferred embodiments of the present invention will now be described below with reference to the accompanying drawings. For the gallium nitride semiconductor device of the present invention, GaN, AlN or InN, or a gallium nitride semiconductor ($In_xAl_yGa_{1-x-y}N$, $0 \leq X$, $0 \leq Y$, $X+Y \leq 1$) that is a mixed crystal of the former may be used, or a mixed crystal formed by substituting a part of these materials with B or P may be used.

Now a gallium nitride semiconductor laser will be introduced as an example of the gallium nitride semiconductor device.

Figure 1:
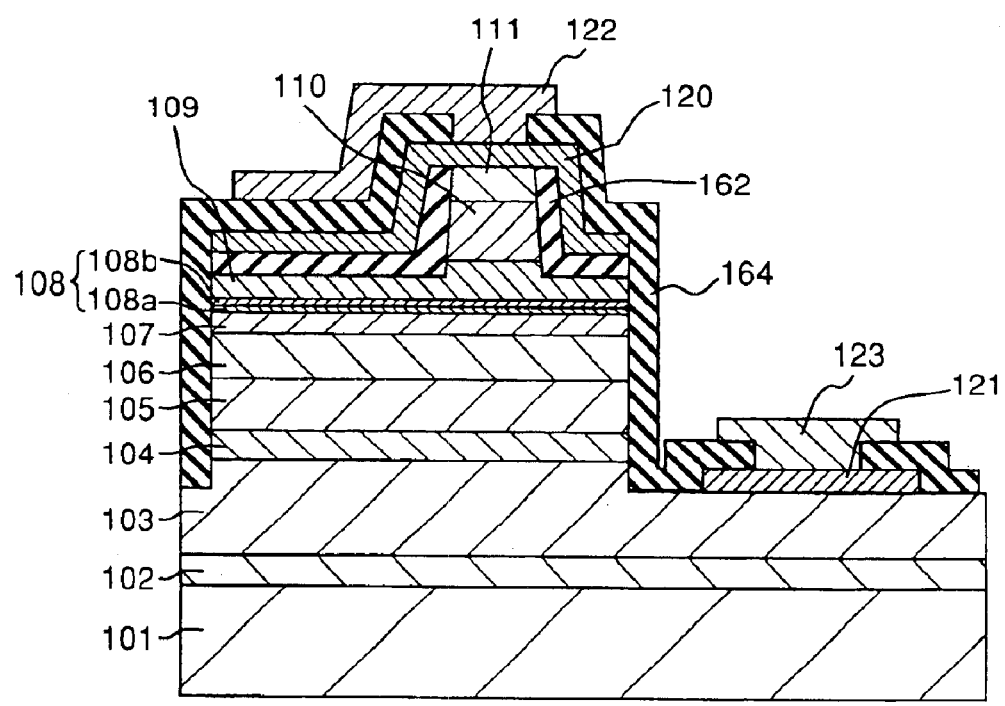
FIG. 1 is a schematic sectional view explanatory of an embodiment of the present invention.
Figure 2A:
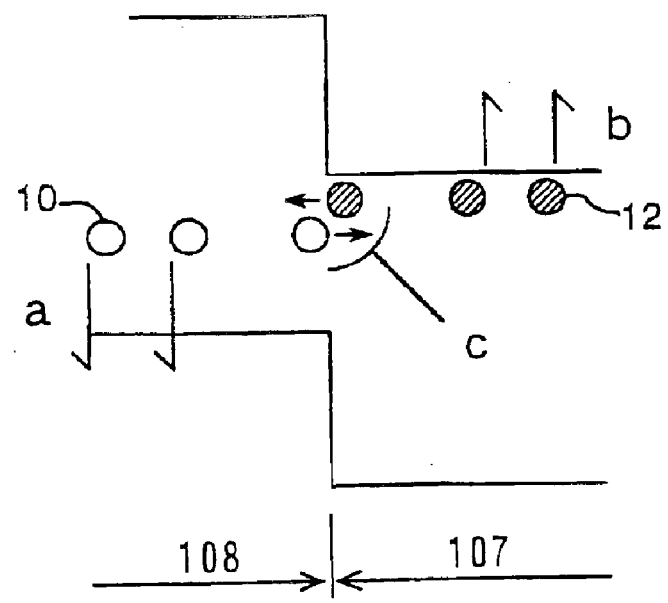
FIGS. 2A and 2B are schematic diagrams showing a region near the interface between active layer and p-type cap layer of the gallium nitride semiconductor device of the prior art (FIG. 2A) and that of the present invention (FIG. 2B).
Figure 2B:
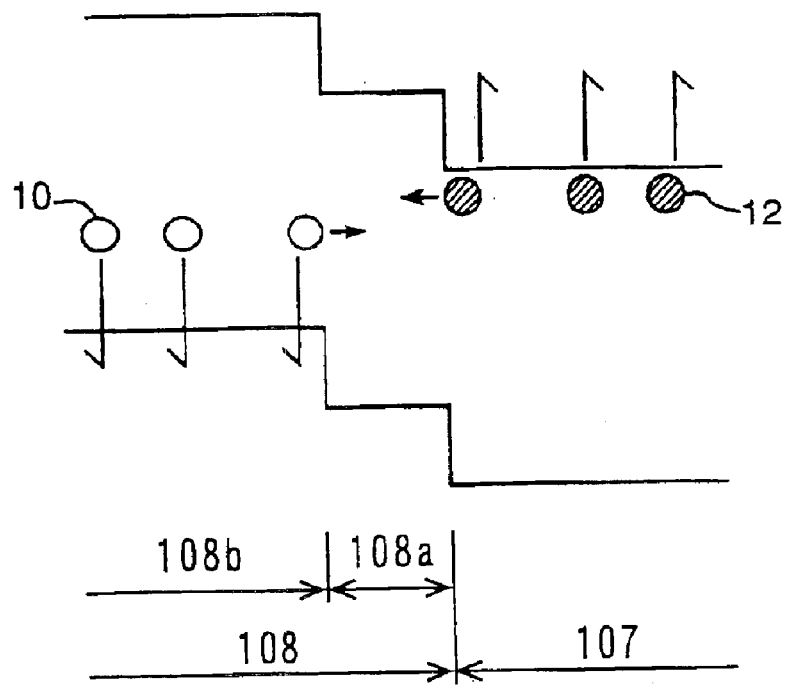
Figure 3:
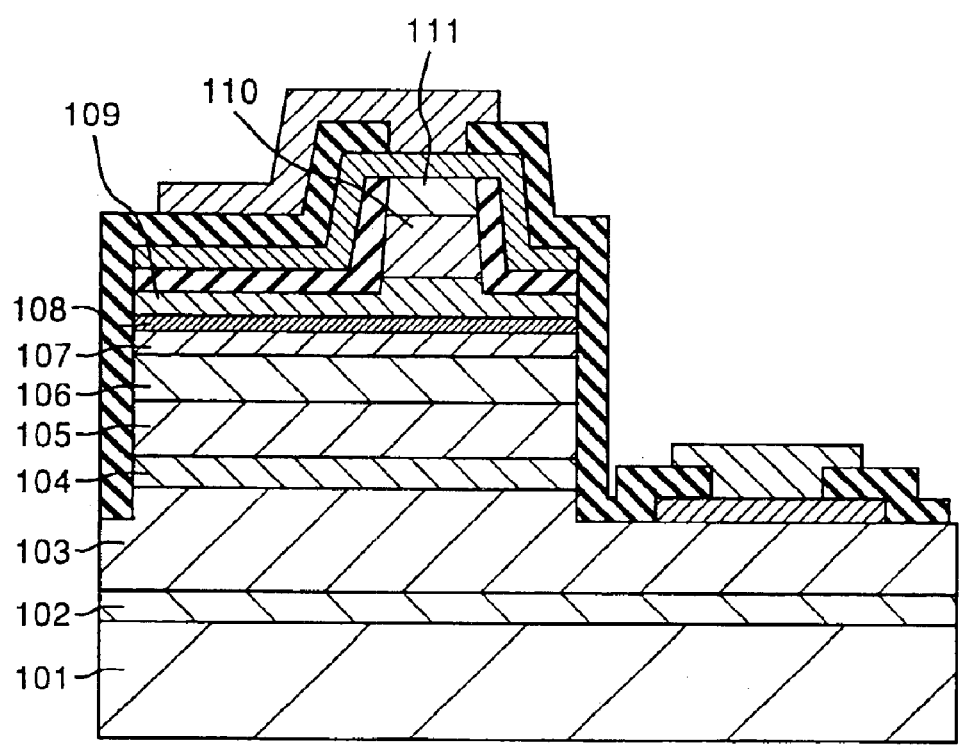
FIG. 3 is a schematic sectional view showing an example of the gallium nitride semiconductor device of the prior art.

FIG. 1 is a sectional view showing the gallium nitride semiconductor laser according to the present invention. The nitride semiconductor laser of FIG. 1 has such a structure as active layer 107 made of $In_aGa_{1-a}N$ ($0 \leq a<1$) is interposed between n-type $Al_bGa_{1-b}N$ layers ($0 \leq b<1$) 103 to 106 (value of b varies from layer to layer) and p-type $Al_cGa_{1-c}N$ layers ($0 \leq c<1$) 108 to 111 (value of c varies from layer to layer), thereby forming the so-called double heterojunction structure.

The active layer 107 has such an MQW structure (multiple quantum well structure) as $In_{x1}Ga_{1-x1}N$ well layers ($0<x1<1$) and $In_{x2}Ga_{1-x2}N$ barrier layers ($0 \leq x2<1$, $x1>x2$) are stacked alternately for a required number of times. The well layer is formed undoped, while all barrier layers are doped with n-type impurity such as Si or Sn. Doping the barrier layers with the n-type impurity increases the initial electron concentration in the active layer, thereby improving the efficiency of injecting electrons into the well layer, thus resulting in improved efficiency of the laser to emit light. The active layer 107 may end with a well layer or end with a barrier layer. Since the active layer 107 includes a relatively high content of InN that has a high vapor pressure to form a mixed crystal, it is easy to decompose and can be grown at a lower temperature (about 900° C.) than the other layers.

The cap layer 108 is constituted from two layers; a first cap layer 108a that is grown undoped and a second cap layer 108b grown while doping with a high concentration of Mg.

The first cap layer 108a functions to prevent Si injected into the barrier layer of the n-type active layer 107 and Mg injected into the second cap layer 108b from canceling each other, and is made, for example, by growing GaN layer, $In_xGa_{1-x}N$ layer ($0<x<1$) or $Al_yGa_{1-y}N$ layer ($0<y<1$), or a stack of two or more of these layers without doping. The thickness of the first cap layer 108a is about 15 Å or more, and is not larger than the sum of the thermal diffusion distance traveled by Si, that is injected into the active layer 107, in the first cap layer 108a and the thermal diffusion distance traveled by Mg, that is injected into the second cap layer 108b, in the first cap layer 108a. Thermal diffusion distance L traveled by Si and Mg in the first cap layer 108a can be given by the equation described previously. This constitution makes it possible to prevent Si drifting from the n-type active layer 107 by thermal diffusion and Mg drifting from the second cap layer 108b by thermal diffusion from coexisting with each other.

In case the first cap layer 108a is made by growing a stack of two or more of GaN layer, $In_xGa_{1-x}N$ layer ($0<x<1$) and $Al_yGa_{1-y}N$ layer ($0<y<1$) without doping, the thickness of the first cap layer is preferably from 15 to 150 Å when the stack includes InGaN, or from 15 to 100 Å when the stack includes GaN. This makes it possible to obtain a nitride semiconductor laser having high effect of suppressing the compensation of impurities similarly to the case of forming the first cap layer in a single layer.

Concentration of Si that has drifted from the n-type active layer 107 into the first cap layer 108a decreases gradually in the first cap layer 108a from the interface thereof with the n-type active layer 107 toward the interface with the second cap layer 108b. Conversely, concentration of Mg that has drifted from the second cap layer 108b into the first cap layer 108a decreases gradually in the first cap layer from the interface thereof with the second cap layer 108b toward the interface with the n-type active layer 107. Due to the thermal diffusion from the n-type active layer 107 and the second cap layer 108b, concentrations of Mg and Si included in the first cap layer 108a are not higher than $1.0 \times 10^{17}$ cm$^{-3}$, The first cap layer 108a may also be grown while doping with impurity such as Si or Mg in a low concentration (such a low concentration that the final concentration after the thermal diffusion from the active layer and the second cap layer would not be higher than $1.0 \times 10^{17}$ cm$^{-3}$). The first cap layer 108a has type i since the same quantities of n-type and p-type impurities are included therein.

Since the first cap layer 108a suppresses dissociation of In in the active layer 107, it is preferably grown at substantially the same temperature (900° C.) as the active layer 107. Growing the first cap layer 108a at a temperature lower than that for the active layer 107 may cause In to diffuse from the active layer 107 thereto, and growing it at a temperature higher than that for the active layer 107 makes In easier to dissociate in the active layer.

The second cap layer 108b has the function to supply holes to the active layer 107 and confine electrons in the active layer, and is made by doping $Al_zGa_{1-z}N$ layer ($0<z<1$, more preferably $0.1<z<0.5$) with Mg as the p-type impurity in concentration from $8.0 \times 10^{18}$ to $2.0 \times 10^{19}$ cm$^{-3}$. The second cap layer 108b is preferably grown at a high temperature of 1000° C. or higher, in order to form it in a thin film that has good crystallinity. Mg injected into the second cap layer 108b drifts toward the base layer by thermal diffusion, but hardly mixes with Si that has diffused from the n-type active layer 107, due to the presence of the first cap layer 108a. As a result, substantially all Mg injected into the second cap layer 108b contribute to the creation of effective carrier, so that laser oscillation of similar level can be achieved with lower concentration of Mg doping as that of the p-type cap layer of the prior art that is formed directly on the n-type active layer.

Concentration of the n-type impurity in a layer made of gallium nitride semiconductor doped with the n-type impurity, that is nearest to the first cap layer among the active layers, is preferably in a range from $5.0 \times 10^{17}$ to $1.0 \times 10^{19}$ cm$^{-3}$.

Now the structure of the nitride semiconductor laser shown in FIG. 1 will be described in detail. While a substrate 101 is preferably made of GaN, it may also be made of a material other than nitride semiconductor. For the substrate made of a material other than nitride semiconductor, those known in the prior art to be capable of growing nitride semiconductor thereon can be used. For example, insulating substrate such as sapphire substrate that has principal plane in either C plane, R plane or A plane and spinel (MgAl$_2$O$_4$), SiC (6H, 4H, 3C included), ZnS, ZnO, GaAs, Si and oxides that make lattice matching with the nitride semiconductor can be used. The substrate made of a different material is preferably made of sapphire or spinel. The substrate made of a different material may also be grown off-angle. In this case, it is preferable to grow off-angle in stepwise manner which allows the base layer made of gallium nitride to grow with good crystallinity. When a substrate made of a different material is used, device structure may be formed in a single substrate of nitride semiconductor, by growing the nitride semiconductor, that makes the base layer before forming the device structure, on the substrate made of different material, followed by the removal of the substrate made of different material by polishing or the like. The substrate made of a different material may also be removed after forming the device structure.

When a substrate made of different material is used, nitride semiconductor can be grown better by forming the device structure via a buffer layer (layer grown at a low temperature) and a base layer made of nitride semiconductor (preferably GaN). When the base layer (growth substrate) to be provided on the substrate made of a different material is made of nitride semiconductor which is grown by ELOG (Epitaxially Laterally Overgrowth) process, the growth substrate of good crystallinity can be obtained. Specific examples of ELOG-grown layer include the following. First, nitride semiconductor layer is grown on a substrate made of a different material, then masked regions where a protective film upon which nitride semiconductor is difficult to grow is provided and non-masked regions where nitride semiconductor it to be grown are formed in a stripe pattern. When nitride semiconductor is grown from the non-masked region, the growth occurs not only in the direction of film thickness but also in lateral direction. As a result, nitride semiconductor film is formed also in the masked region. In another form, an opening is formed in a nitride semiconductor layer that has been grown on a substrate made of different material, and the nitride semiconductor layer is formed by growing from the side faces of the opening in the lateral direction.

Formed via the buffer layer 102 on the substrate 101 are the n-type contact layer 103, the crack prevention layer 104, the n-type cladding layer 105 and the n-type optical guide layer 106, that are n-type gallium nitride semiconductors. Layers other than the n-type cladding layer 105 may be omitted depending on the device. The n-type gallium nitride semiconductor is required to have a band gap wider than that of the active layer at least in a portion that makes contact with the active layer, and preferably has a composition that includes Al. The layers may be grown either while doping with an n-type impurity so as to become n-type, or without doping so as to become n-type.

The active layers 107 are formed on the n-type gallium nitride semiconductors 103 to 106. As described previously, the active layer 107 has such an MQW structure as In$_{x1}$Ga$_{1-x1}$N well layer (0<x1<1) and In$_{x2}$Ga$_{1-x2}$N barrier layer (0≦x2<1, x1>x2) are stacked alternately a required number of times. The well layers are formed without doping, and all barrier layers are doped with n-type impurity such as Si or Sn in a concentration from $1 \times 10^{17}$ to $1 \times 10^{19}$ cm$^{-3}$.

Formed on the active layer 107 are the first cap layer 108a and the second cap layer 108b. While the first cap layer 108a is grown without doping as described previously, it includes n-type impurities such as Si due to diffusion from the active layer 107 that serves as the base layer, and includes p-type impurities such as Mg due to diffusion from the second cap layer 108b to be grown next. As a result, concentration of the n-type impurity in the first cap layer 108a is lower than in the active layer 107, and concentration of the p-type impurity in the first cap layer 108a is lower than in the second cap layer 108b, both not higher than $1 \times 10^{17}$ cm$^{-3}$.

The second cap layer 108b is made of a p-type gallium nitride semiconductor that has higher mixed crystal proportion of Al than in the p-type cladding layer 110, and preferably has a composition of Al$_z$Ga$_{1-z}$N (0<z<1). This layer is doped with includes p-type impurities such as Mg in a concentration from $8 \times 10^{18}$ to $2 \times 10^{19}$ cm$^{-3}$.

Formed on the second cap layer 108b are the p-type optical guide layer 109, the p-type cladding layer 110 and the p-type contact layer 111. Layers other than the p-type cladding layer 110 may be omitted depending on the device. The p-type gallium nitride semiconductors are required to have a band gap wider than that of the active layer at least in a portion that makes contact with the active layer, and therefore preferably have a composition that includes Al. The layers may be grown either while doping with a p-type impurity so as to be p-type, or without doping so as to be p-type.

The first cap layer and the second cap layer are preferably formed so that the band gap energy increases with the distance from the active layer (offset). That is, the first cap layer is formed to have a band gap energy higher than in any other layers of the active layer, and the second cap layer is formed to have a band gap energy higher than in the first cap layer. This constitution makes it possible to most effectively confine electrons and suppress the overflow of carriers. In a preferred form, layers adjacent to the first cap layer in the active layer are made of In$_x$Ga$_{1-x}$N (0<x<1), the first cap layer is made of GaN and the second cap layer is made of Al$_y$Ga$_{1-y}$N layer (0<y<1). Alternatively, layers adjacent to the first cap layer in the active layer are made of In$_x$Ga$_{1-x}$N (0<x<1), the first cap layer is made of GaN and Al$_y$Ga$_{1-y}$N layer (0<y<1) stacked alternately and the second cap layer is made of Al$_y$Ga$_{1-y}$N layer (0<y<1). These two forms provide better crystallinity as it is nearer to the active layer, and therefore elongates the lifetime of the laser device.

The n-type gallium nitride semiconductor and the p-type gallium nitride semiconductor may have a structure provided with optical guide layer in an end-emitting light emitting device such as laser device. The optical guide layer makes the structure provided with a waveguide. The optical guide layer is formed so as to have a band gap energy higher than the well layer that is formed in the active layer, and smaller difference in refractive index between the active layer and the optical guide layer. This constitution provides a good waveguide. The optical guide layer may be formed either in super lattice structure or in a single film. When formed in a single film, it is made easier for current to flow and $V_f$ to decrease compared to a case where it is formed in super lattice structure. In this case, the single film single film is formed to such a thickness that ensures at least there would not be quantum effect, and preferably to a thickness larger than any of the barrier layer, the first cap layer and the second cap layer, and more preferably to a thickness of 300 Å or more.

Among the p-type gallium nitride semiconductor, ridge stripes are formed up to midway of the p-type optical guide layer 109, whereon protective films 161, 162, a p-type electrode 120, an n-type electrode 121, a p pad electrode 122 and an n pad electrode 123 are formed thereby constituting the semiconductor laser.

Now the gallium nitride semiconductor laser having the structure shown in FIG. 1 will be described below as an embodiment. While the first cap layer is grown without doping in any of the first to seventh embodiments, the final concentrations of the n-type impurity and the p-type impurity in the first cap layer of the laser are not higher than $1.0 \times 10^{17}$ cm$^{-3}$.

[Embodiment 1]
(Substrate 101)

A nitride semiconductor, GaN in this embodiment, is grown into a thick film (100 μm) on a substrate made of a different material. After removing the substrate of the different material, a nitride semiconductor substrate made of GaN with a thickness of 80 μm is made. Detailed process of forming the substrate is as follows. A substrate of different material made of sapphire that has the principal plane lying in the C plane having diameter of 2 inches is set in an MOVPE reaction vessel, of which temperature is set to 500° C., and a buffer layer made of GaN is formed to a thickness of 200 Å by flowing trimethyl gallium (TMG) and ammonia (NH$_3$) gases. With the temperature raised, a film of undoped GaN with thickness of 1.5 μm is grown as a base layer. Then with a plurality of masks having stripe pattern formed on the base layer surface, a nitride semiconductor, GaN in this embodiment, is selectively grown through apertures (windows) of the mask. The nitride semiconductor layer formed by a growing process involving lateral growth (ELOG) is further grown to become thicker. Then the nitride semiconductor substrate is obtained by removing the substrate of different material, the buffer layer and the base layer. At this time, the mask used in the selective growth is made of SiO$_2$ having mask width of 15 μm and aperture (opening) width of 5 μm.

(Buffer Layer 102)

A buffer layer 102 made of Al$_{0.05}$Ga$_{0.95}$N is formed to a thickness of 4 μm on the nitride semiconductor substrate with the temperature set to 1015° C. and using TMG (trimethyl gallium), TMA (trimethyl aluminum) and ammonia. This layer functions as a buffer layer between the n-type contact layer made of AlGaN and the nitride semiconductor substrate made of GaN.

(n-Type Contact Layer 103)

The n-type contact layer 103 made of Al$_{0.05}$Ga$_{0.95}$N doped with Si is formed to a thickness of 4 μm at a temperature of 1015° C. on the buffer layer 102, which has been formed as described above, by using TMG, TMA, ammonia, and silane gas used as an impurity gas.

(Crack Preventing Layer 104)

Then the crack preventing layer 104 made of In$_{0.06}$Ga$_{0.94}$N is formed to a thickness of 0.15 μm at a temperature of 900° C. by using TMG, TMI (trimethyl indium) and ammonia. The crack preventing layer may be omitted.

(n-Type Cladding Layer 105)

Then with the temperature being set to 1015° C., after growing a layer A made of undoped Al$_{0.05}$Ga$_{0.95}$N to a thickness of 25 Å by using TMA, TMG and ammonia as the stock material gas, supply of TMA is stopped and a layer B made of GaN doped with Si in concentration of $5 \times 10^{18}$/cm$^3$ is formed by using silane gas used as an impurity gas. These operations are repeated 200 times so as to stack the layers A and the layers B thereby to form the n-type cladding layer 106 made in multi-layered film (super lattice structure) having a total thickness of 1 μm. At this time, a difference in the refractive index which is sufficient to enable the cladding layer to function can be provided when the mixed crystal proportion of Al in the undoped AlGaN is in a range from 0.05 to 0.3.

(n-Type Optical Guide Layer 106)

Then at a similar temperature, the optical guide layer 106 made of undoped GaN is formed to a thickness of 0.15 μm by using TMA and ammonia as the stock material gas. This layer may also be doped with an n-type impurity.

(Active Layer 107)

Then with the temperature set to 900° C., a barrier layer (B) made of In$_{0.05}$Ga$_{0.95}$N doped with Si in a concentration of $5 \times 10^{18}$/cm$^3$ is formed to a thickness of 140 Å by using TMI (trimethyl indium), TMG and ammonia as the stock material gas and silane gas as the impurity gas. Then the supply of silane gas is stopped and a well layer (W) made of undoped In$_{0.1}$Ga$_{0.9}$N is formed to a thickness of 40 Å. The barrier layers (B) and well layer (W) are stacked on each other in the order of (B)/(W)/(B)/(W) . . . /(B) with a barrier layer formed as the last layer. The active layer 107 is made in multiple quantum well structure (MQW) having a total thickness of 500 Å.

(First Cap Layer 108*a*)

Then at a similar temperature, the first cap layer 108*a* made of GaN is formed to a thickness of 75 Å by using TMA, TMG and ammonia as the stock material gas.

(Second Cap Layer 108*b*)

Then with the temperature raised to 1000° C., the second cap layer 108*b* made of Al$_{0.3}$Ga$_{0.7}$N doped with Mg in a concentration of $7.5 \times 10^{18}$/cm$^3$ is formed to a thickness of 100 Å by using TMA, TMG and ammonia as the stock material gas and Cp$_2$Mg (cyclopentadienyl magnesium) as the impurity gas.

(p-Type Optical Guide Layer 109)

Then by setting the temperature to 1000° C., the p-type optical guide layer 109 made of undoped GaN is formed to a thickness of 0.15 μm by using TMG and ammonia as the stock material gas. Although the p-type optical guide layer 109 is grown undoped, Mg concentration therein reaches $5 \times 10^{16}$/cm$^3$ so as to be p-type due to the diffusion of Mg from adjacent layers such as the p-type electron confinement layer 108 and the p-type cladding layer 109. This layer may also be grown while intentionally doping it with Mg.

(p-Type Cladding Layer 110)

Then a layer made of undoped Al$_{0.05}$Ga$_{0.95}$N is formed to a thickness of 25 Å at 1000° C., then supply of TMA is stopped, and using Cp$_2$Mg, a layer made of GaN doped with Mg is formed to a thickness of 25 Å. This operation is repeated 90 times so as to form the p-type cladding layer 110 constituted from super lattice structure having a total thickness of 0.45 μm. The p-type cladding layer may be formed in super lattice structure consisting of nitride semiconductor layers of different band gap energy levels, with at least one of the layers including a nitride semiconductor layer that includes Al, being stacked one on another. In this case, crystallinity tends to be improved by doping one of the layers more heavily than the other, in the so-called modulated doping. However, such a constitution as both layers are doped similarly may also be employed. The cladding layer 110 is preferably formed in super lattice structure that includes a nitride semiconductor where Al is included, and preferably $Al_XGa_{1-X}N$ layer (0<X<1); and more preferably in super lattice structure wherein GaN and AlGaN are stacked one on another. Forming the p-type cladding layer 110 in super lattice structure enables it to increase the mixed proportion of Al throughout the entire cladding layer, resulting in lower refractive index of the cladding layer and higher band gap energy, which are effective in decreasing the threshold. Moreover, the super lattice structure makes the probability of pits to be generated in the cladding layer lower than in a case without supper lattice, and occurrence of short circuiting is also reduced.

(p-Type Contact Layer 111)

Last, at a temperature of 1000° C., the p-type contact layer 111 made of p-type GaN doped with Mg in a concentration of $1 \times 10^{20}/cm^3$ is formed to a thickness of 150 Å on the p-type cladding layer 110. The p-type contact layer 111 may be formed from p-type $In_XAl_YGa_{1-x-y}N$ (0≦X, 0≦Y, X+Y≦1), and preferably from GaN doped with Mg, which enables it to achieve the best ohmic contact with the p-type electrode 120. Since the contact layer 111 is the layer whereon the electrode is to be formed, it is desirable to have a high carrier concentration of $1 \times 10^{17}/cm^3$ or higher. When the concentration is lower than $1 \times 10^{17}/cm^3$, it becomes difficult to achieve satisfactory ohmic contact with the electrode. Forming the contact layer in a composition of GaN makes it easier to achieve satisfactory ohmic contact with the electrode. After the reaction has finished, the wafer is annealed in nitrogen atmosphere at 700° C. in the reaction vessel thereby to further decrease the electrical resistance of the p-type layer.

After forming the nitride semiconductor layers one on another as described above, the wafer is taken but of the reaction vessel, and a protective film made of $SiO_2$ is formed on the surface of the topmost p-type contact layer. Then the surface of the n-type contact layer 103 whereon the n-type electrode is to be formed is exposed as shown in FIG. 1 by etching with $SiCl_4$ gas in the RIE (reactive ion etching) process. For the purpose of deep etching of the nitride semiconductor, $SiO_2$ is best suited as the protective film.

Then ridge stripe is formed as the striped waveguide region described above. First, a first protective film 161 having thickness of 0.5 μm is formed from Si oxide (mainly $SiO_2$) over substantially the entire surface of the topmost p-type contact layer (upper contact layer) by means of a PDV apparatus. Then the first protective film 161 is provided with a mask of a predetermined configuration, and is patterned with stripe width of 1.6 μm by means of photolithography process in the RIE (reactive ion etching) apparatus which employs $CF_4$ gas. At this time, height of the ridge stripe (depth of etching) is set so that thickness of the p-type optical guide layer 109 becomes 0.1 μm by partially etching the p-type contact layer 111, the p-type cladding layer 109 and the p-type optical guide layer 110 in forming the ridge stripe.

After forming the ridge stripe, the second protective layer 162 made of Zr oxide (mainly $ZrO_2$) is formed on the first protective layer 161 to a thickness of 0.5 μm continuously over the first protective layer 161 and the p-type optical guide layer 109 which has been exposed by etching.

After forming the second protective film 162, the wafer is subjected to heat treatment at 600° C. When the second protective film is formed from a material other than $SiO_2$, it is preferable to apply heat treatment at a temperature not lower than 300° C., preferably 400° C. or higher but below the decomposition temperature of the nitride semiconductor (1200° C.), after forming the second protective film. Since the heat treatment makes the second protective film less soluble to the material (hydrofluoric acid) that dissolves the first protective film, it is furthermore desirable to add this process.

Then the wafer is dipped in hydrofluoric acid so as to remove the first protective film 161 by the lift-off process. Thus the first protective film 161 provided on the p-type contact layer 111 is removed thereby to expose the p-type contact layer. Thus the second protective film 162 is formed on the side faces of the ridge stripe and on the plane which continues therefrom (exposed surface of the p-type optical guide layer 109) as shown in FIG. 1.

After the first protective film 161 provided on the p-type contact layer 112 is removed as described above, the p-type electrode 120 made of Ni/Au is formed on the surface of the exposed p-type contact layer 111 as shown in FIG. 1. The p-type electrode 120 is formed with stripe width of 100 μm over the second protective film 162 as shown in FIG. 1. After forming the second protective film 162, the n-type electrode 121 made of Ti/Al in stripe configuration is formed in a direction parallel to the stripe on the n-type contact layer 103 which has been already exposed.

Then the p-type and n-type electrodes are masked over the regions thereof where lead-out electrodes are to be formed, and a multi-layered dielectric film 164 made of $SiO_2$ and $TiO_2$ is formed. Lead-out (pad) electrodes 122, 123 made of Ni—Ti—Au (1000 Å-1000 Å-8000 Å) are formed on the p-type and n-type electrodes. At this time, the active layer 107 is formed with a width of 200 μm (width in the direction perpendicular to the resonator direction). The multi-layered dielectric film made of $SiO_2$ and $TiiO_2$ are formed also on the resonator surface (reflector side).

After forming the n-type electrode and the p-type electrode as described above, the wafer is divided into bar shape along M plane (M plane of GaN, (11-00) or the like) of the nitride semiconductor in the direction perpendicular to the striped electrode. The wafer of bar shape is further divided to obtain laser devices with the resonator length being 650 μm.

Thus a laser device capable of continuous oscillation at a wavelength of 405 nm with threshold value of $2.8 \text{ kA/cm}^2$ and output of 5 to 30 mW at the room temperature is obtained. The laser device thus obtained has lifetime of about 2000 hours under the condition of continuous oscillation with output power of 5 mW at temperature 60° C., and shows characteristic temperature higher than that of comparative embodiment to be described later.

[Embodiment 2]

A gallium nitride semiconductor laser is made similarly to the first embodiment, except for the first cap layer 108a. The first cap layer 108a made of undoped $Al_{0.3}Ga_{0.7}N$ is grown to a thickness of about 35 Å by using TMA, TMG and ammonia as the stock material gas at temperature of 900° C. This gallium nitride semiconductor laser also shows lifetime and characteristic temperature similar to those of the first embodiment.

[Embodiment 3]

A gallium nitride semiconductor laser is made similarly to the first embodiment, except for the first cap layer 108a. The first cap layer 108a made of undoped $In_{0.05}Ga_{0.95}N$ is grown to a thickness of about 100 Å by using TMI (trimethyl indium), TMG and ammonia as the stock-material gas at temperature of 900° C. This gallium nitride semiconductor laser also shows lifetime and characteristic temperature similar to those of the first embodiment.

[Embodiment 4]

A gallium nitride semiconductor laser is made similarly to the third embodiment, except for making a well layer having thickness of about 40 Å as the last layer of the active layer 107 and thickness of the first cap layer 108a is set to about 60 Å. This gallium nitride semiconductor laser also shows lifetime and characteristic temperature similar to those of the first embodiment.

[Embodiment 5]

A gallium nitride semiconductor laser is made similarly to the third embodiment, except for growing the active layer 107, the first cap layer 108a and the second cap layer 108b in such a process as described below.

(Active Layer 107)

Then with the temperature set to 900° C., a barrier layer (B) made of $In_{0.05}Ga_{0.95}N$ doped with Si in a concentration of $5\times10^{18}/cm^3$ is formed to a thickness of 140 Å by using TMI (trimethyl indium), TMG and ammonia as the stock material gas and silane gas as the impurity gas. Then the supply of silane gas is stopped and a well layer (W) made of undoped $In_{0.1}Ga_{0.9}N$ is formed to a thickness of 70 Å, while stacking the barrier layers (B) and the well layers (W) in the order of (B)/(W)/(B)/(W) . . . /(B) with the barrier layer formed as the last layer. Only the last layer is doped with Si in a concentration of $1\times10^{18}/cm^3$. The active layer 107 is made in multiple quantum well structure (MQW) having a total thickness of 560 Å.

(First Cap Layer 108a)

Then at a similar temperature, the first cap layer 108a made of $Al_{0.15}Ga_{0.85}N$ is formed to a thickness of 30 Å by using TMA, TMG and ammonia as the stock material gas.

(Second Cap Layer 108b)

Then with the temperature raised to 1000° C., the second cap layer 108b made of $Al_{0.25}Ga_{0.75}N$ doped with Mg in a concentration of $7.5\times10^{18}/cm^3$ is formed to a thickness of 70 Å by using TMA, TMG and ammonia as the stock material gas and $Cp_2Mg$ (cyclopentadienyl magnesium) as the impurity gas.

The laser device obtained in the process described above is capable of continuous oscillation at a wavelength of 405 nm with threshold value of 2.8 kA/cm² and output power of 5 to 30 mW at the room temperature. The laser device thus obtained has lifetime of about 3500 hours under the condition of continuous oscillation with output power of 5 mW at temperature 60° C., and shows a characteristic temperature higher than that of comparative embodiment to be described later

[Embodiment 6]

A gallium nitride semiconductor laser is made similarly to the fifth embodiment, except for growing the first cap layer 108a and the second cap layer 108b in such a process as described below.

(First Cap Layer 108a)

The first cap layer 108a made of GaN is formed to a thickness of 30 Å by using TMA, TMG and ammonia as the stock material gas at 900° C.

(Second Cap Layer 108b)

Then with the temperature raised to 1000° C., the second cap layer 108b made of $Al_{0.25}Ga_{0.75}N$ doped with Mg in a concentration of $7.5\times10^{16}/cm^3$ is formed to a thickness of 100 Å by using TMA, TMG and ammonia as the stock material gas and $Cp_2Mg$ (cyclopentadienyl magnesium) as the impurity gas.

The laser device obtained in the process described above is capable of continuous oscillation at a wavelength of 405 nm with threshold value of 2.8 kA/cm² and output power of 5 to 30 mW at the room temperature. The laser device thus obtained has lifetime of about 3000 hours under the condition of continuous oscillation with output power of 5 mW at temperature 60° C., while showing a characteristic temperature higher than those of comparative embodiment to be described later

[Embodiment 7]

A gallium nitride semiconductor laser is made similarly to the first embodiment, except for growing the active layer 107, the first cap layer 108a and the second cap layer 108b in such a process as described below.

(Active Layer 107)

Then with the temperature set to 900° C., a barrier layer (B) made of $In_{0.05}Ga_{0.95}N$ doped with Si in a concentration of $5\times10^{18}/cm^3$ is formed to a thickness of 140 Å by using TMI (trimethyl indium), TMG and ammonia as the stock material gas and silane gas as the impurity gas. Then the supply of silane gas is stopped and a well layer (W) made of undoped $In_{0.1}Ga_{0.9}N$ is formed to a thickness of 70 Å. The barrier layers (B) and the well layers (W) are stacked in the order of (B)/(W)/(B)/(W) . . . /(B) with the barrier layer formed as the last layer, which consists of two layers, $In_{0.05}Ga_{0.95}N$ layer (100 Å thick) doped with Si in a concentration of $1\times10^{18}/cm^3$ and undoped $In_{0.05}Ga_{0.95}N$ layer (50 Å thick) being stacked successively. The active layer 107 is made in multiple quantum well structure (MQW) having a total thickness of 570 Å.

(First Cap Layer 108a)

Then at a similar temperature, the first cap layer 108a made of $Al_{0.15}Ga_{0.85}N$ is formed to a thickness of 30 Å by using TMA, TMG and ammonia as the stock material gas.

(Second Cap Layer 108b)

Then with the temperature raised to 1000° C., the second cap layer 108b made of $Al_{0.25}Ga_{0.75}N$ doped with Mg in a concentration of $7.5\times10^{18}/cm^3$ is formed to a thickness of 70 Å by using TMA, TMG and ammonia as the stock material gas and $Cp_2Mg$ (cyclopentadienyl magnesium) as the impurity gas.

The laser device obtained in the process described above is capable of continuous oscillation at a wavelength of 405 nm with threshold value of 2.8 kA/cm² and output power of 5 to 30 mW at the room temperature. The laser device thus obtained has lifetime of about 2800 hours under the condition of continuous oscillation with output power of 5 mW at temperature 60° C., and shows a characteristic temperature higher than those of the comparative embodiment to be described later

[Modified Embodiment 1]

A gallium nitride semiconductor laser is made as the first modified embodiment similarly to the first embodiment, except for growing the active layer 107, the first cap layer 108a and the second cap layer 108b in such a process as described below.

(Active Layer 107)

Then with the temperature set to 900° C., a barrier layer (B) made of $In_{0.05}Ga_{0.95}N$ doped with Si in a concentration of $5\times10^{18}/cm^3$ is formed to a thickness of 140 Å by using TMI (trimethyl-indium), TMG and ammonia as the stock material gas and silane gas as the impurity gas. Then the supply of silane gas is stopped and a well layer (W) made of undoped $In_{0.1}Ga_{0.9}N$ is formed to a thickness of 70 Å. The barrier layers (B) and the well layers (W) are stacked in the order of (B)/(W)/(B)/(W) . . . /(B) with the barrier layer formed as the last layer, which is the only one formed without doping. The active layer 107 is made in multiple quantum well structure (MQW) having a total thickness of 560 Å.

(First Cap Layer 108a)

Then at a similar temperature, the first cap layer 108a made of GaN is formed to a thickness of 30 Å by using TMA, TMG and ammonia as the stock material gas.

(Second Cap Layer 108b)

Then with the temperature raised to 1000° C., the second cap layer 108b made of $Al_{0.25}Ga_{0.75}N$ doped with Mg in a concentration of $7.5\times10^{18}/cm^3$ is formed to a thickness of 70 Å by using TMA, TMG and ammonia as the stock material gas and $Cp_2Mg$ (cyclopentadienyl magnesium) as the impurity gas.

In this laser device, the layer made of gallium nitride semiconductor doped with n-type impurity that is nearest to the first cap layer 108a becomes Si-doped barrier layer sandwiching undoped well layer with undoped barrier layer, wherein a total thickness of the undoped layers between the layer doped with n-type impurity and the layer doped with p-type impurity is 240 Å.

The laser device obtained in the process described above has lifetime shorter than those of all the other embodiments but longer than that of the first to third comparative embodiments.

[Comparative Embodiment 1]

A gallium nitride semiconductor laser is made as the first modified embodiment similarly to the first embodiment, except for growing the second cap layer 108b directly on the active layer 107 without forming the first cap layer 108a. A laser device obtained in the process described above is capable of continuous oscillation at a wavelength of 405 nm with threshold value of 4.0 kA/cm² and output power of 5 to 30 mW at the room temperature. The laser device has lifetime of about 1000 hours under the condition of continuous oscillation with output power of 5 mW at temperature 60° C., and shows characteristic temperature of about 200K.

[Comparative Embodiment 2]

A gallium nitride semiconductor laser is made similarly to the first embodiment, except for growing the second cap layer 108b directly on the active layer 107 without forming the first cap layer 108a in a process as described below.

(Second Cap Layer 108b)

Then with the temperature raised to 1000° C., the second cap layer 108b made of $Al_{0.3}Ga_{0.7}N$ doped with Mg in a concentration of $1\times10^{19}/cm^3$ is formed to a thickness of 100 Å by using TMA, TMG and ammonia as the stock material gas and $Cp_2Mg$ (cyclopentadienyl magnesium) as the impurity gas.

A laser device obtained in the process described above is capable of continuous oscillation at a wavelength of 405 nm with threshold value of 2.8 kA/cm² and output of 5 to 30 mW at the room temperature. The laser device has lifetime of about 1000 hours under the condition of continuous oscillation with output of 5 mW at temperature 60° C., and shows characteristic temperature of about 200K.

[Comparative Embodiment 3]

A gallium nitride semiconductor laser is made similarly to the first embodiment, except for growing the first cap layer 108a and the second cap layer 108b in such a process as described below.

(First Cap Layer 108a)

The first cap layer 108a made of GaN doped with Mg in a concentration of $1\times10^{19}/cm^3$ is formed at 900° C. to a thickness of 30 Å by using TMA, TMG and ammonia as the stock material gas and $Cp_2Mg$ (cyclopentadienyl magnesium) as the impurity gas.

(Second Cap Layer 108b)

Then with the temperature raised to 1000° C., the second cap layer 108b made of $Al_{0.25}Ga_{0.75}N$ doped with Mg in a concentration of $7.5\times10^{18}/cm^3$ is formed to a thickness of 100 Å by using TMA, TMG and ammonia as the stock material gas and $Cp_2Mg$ (cyclopentadienyl magnesium) as the impurity gas.

The laser device thus obtained has a short lifetime, about 800 hours in continuous oscillation with output of 5 to 30 mW at 60° C., because of higher concentration of p-type impurity in the first cap layer than in the second cap layer. Also value of Vf is higher than that of the first embodiment, because of lower concentration of p-type impurity in the second cap layer than in the first cap layer.

INDUSTRIAL APPLICABILITY

According to the present invention, compensation of the donor and the acceptor, that occurs near the interface between the active layer and the p-type cap layer, can be suppressed by constituting the p-type cap layer, which is formed on the active layer that includes In, from two layers of the first cap layer having low concentration of impurity (or undoped) and the second cap layer doped with p-type impurity, thus making it possible to reduce the concentration of the p-type impurity in the p-type cap layer and obtain the gallium nitride semiconductor device having long lifetime and excellent temperature characteristic.

What is claimed is:

1. A gallium nitride semiconductor device comprising an active layer made of an n-type gallium nitride semiconductor that includes In and is doped with n-type impurity and a p-type cladding layer made of a p-type gallium nitride semiconductor that includes Al and is doped with p-type impurity, wherein a first cap layer, made of a gallium nitride semiconductor that includes n-type impurity of lower concentration than that of said active layer and p-type impurity of lower concentration than that of said p-type cladding layer, and a second cap layer made of a p-type gallium nitride semiconductor that includes Al and is doped with p-type impurity are stacked one on another between said active layer and said p-type cladding layer.

2. The gallium nitride semiconductor device according to claim 1, wherein said first cap layer is formed in contact with said active layer and said second cap layer is formed in contact with said first cap layer.

3. The gallium nitride semiconductor device according to claim 1, wherein concentration of the n-type impurity and the p-type impurity in said first cap layer is $1.0\times10^{17}$ cm$^{-3}$ or lower, and concentration of the p-type impurity in said second cap layer is from $8.0\times10^{18}$ or to $2.0\times10^{19}$ cm$^{-3}$.

4. The gallium nitride semiconductor device according to claim 1, wherein said first cap layer is grown without being doped with the n-type impurity and the p-type impurity, and includes the n-type impurity due to thermal diffusion from said active layer and the p-type impurity due to thermal diffusion from said second cap layer.

5. The gallium nitride semiconductor device according to claim 1, wherein thickness of said first cap layer is equal to or less than the sum of thermal diffusion distance traveled in said first cap layer by the n-type impurity that is injected into said active layer and thermal diffusion distance traveled in said first cap layer by the p-type impurity that is injected into said second cap layer.

6. The gallium nitride semiconductor device according to claim 1, wherein said first cap layer comprises one selected from a group consisting of GaN layer, $In_xGa_{1-x}N$ layer (0<x<1) and $Al_yGa_{1-y}N$ layer (0<y<1), and a stack of some of these layers.

7. The gallium nitride semiconductor device according to claim 1, wherein said first cap layer comprises GaN layer and has a thickness in a range from 15 to 100 Å.

8. The gallium nitride semiconductor device according to claim 1, wherein said first cap layer comprises $In_xGa_{1-x}N$ layer (0<x<1) and has a thickness in a range from 15 to 150 Å.

9. The gallium nitride semiconductor device according to claim 1, wherein said first cap layer comprises $Al_yGa_{1-y}N$ layer (0<y<1) and has a thickness in a range from 15 to 50 Å.

10. The gallium nitride semiconductor device according to claim 1, wherein the thickness of said second cap layer is in a range from 15 to 500 Å.

11. The gallium nitride semiconductor device according to claim 1, wherein said active layer is formed by stacking well layers made of a gallium nitride semiconductor that includes In and barrier layers made of a gallium nitride semiconductor doped with n-type impurity alternately one on another, while said first cap layer includes n-type impurity in a concentration lower than that in said barrier layer.

12. The gallium nitride semiconductor device according to claim 1,
wherein said active layer is formed by stacking well layers made of gallium nitride semiconductor and barrier layers made of gallium nitride semiconductor, and
wherein the layer that is doped with an n-type impurity and is nearest to the first cap layer among said well layers and barrier layers has the concentration of n-type impurity in a range from $5.0\times10^{17}$ to $1.0\times10^{19}$ cm$^{-3}$.

* * * * *